United States Patent
Zhang et al.

(10) Patent No.: US 9,645,046 B2
(45) Date of Patent: May 9, 2017

(54) FAULT DETECTION SYSTEM AND ASSOCIATED METHOD

(71) Applicant: General Electric Company, Schenectady, NY (US)

(72) Inventors: Pinjia Zhang, Clifton Park, NY (US); Prabhakar Neti, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 1063 days.

(21) Appl. No.: 13/716,933

(22) Filed: Dec. 17, 2012

(65) Prior Publication Data

US 2014/0172326 A1      Jun. 19, 2014

(51) Int. Cl.
  *G01M 13/00*  (2006.01)
  *G01R 31/34*  (2006.01)
  *G01M 13/04*  (2006.01)
  *G06F 17/00*  (2006.01)

(52) U.S. Cl.
  CPC ............ *G01M 13/00* (2013.01); *G01M 13/04* (2013.01); *G01R 31/343* (2013.01); *G06F 17/00* (2013.01)

(58) Field of Classification Search
  None
  See application file for complete search history.

(56) References Cited

U.S. PATENT DOCUMENTS

| | | | |
|---|---|---|---|
| 5,602,757 A | 2/1997 | Haseley et al. | |
| 6,053,047 A | 4/2000 | Dister et al. | |
| 6,321,602 B1 | 11/2001 | Ben-Romdhane | |
| 7,777,516 B2 | 8/2010 | Zhou et al. | |
| 2010/0161245 A1* | 6/2010 | Rai | F01D 21/003 702/35 |
| 2010/0169030 A1 | 7/2010 | Parlos | |
| 2011/0018727 A1 | 1/2011 | Bharadwaj et al. | |
| 2011/0020122 A1 | 1/2011 | Parthasarathy et al. | |
| 2011/0257934 A1 | 10/2011 | Dimino et al. | |
| 2012/0029838 A1 | 2/2012 | Hallman et al. | |
| 2013/0049733 A1* | 2/2013 | Neti | G01R 31/343 324/71.1 |

OTHER PUBLICATIONS

Devaney, M J, et al., "Bearing Damage detection via Wavelet Packet Decomposition of the Stator Current", IEEE Transactions on Instrumentation and Measurement, Apr. 1, 2004, pp. 431-436, IEEE Service Center, Piscataway, N J, USA.*

Aditya, "On-Line Condition Monitoring Of Motors Using Electrical Signature Analysis," 'Recent Advances in Condition-Based Plant Maintenance' seminar organized by the Indian Institute of Plant Engineers on May 17 & 18, 2002 at NITIE, Mumbai., 10 Pages.

(Continued)

*Primary Examiner* — Aditya Bhat
(74) *Attorney, Agent, or Firm* — Ann M. Agosti

(57) ABSTRACT

A method implemented using a processor based device includes obtaining a measured electrical signal from an electrical device coupled to a mechanical device and generating a signal signature representative of a fault in the mechanical device based on the measured electrical signal. The method also includes determining a diagnostic parameter based on a harmonic frequency of the signal signature and determining the fault in the mechanical device based on the diagnostic parameter.

23 Claims, 5 Drawing Sheets

(56) References Cited

OTHER PUBLICATIONS

Neeraj Kumar, "Experimental Investigation Of Faulty Gearbox Using Motor Current Signature Analysis," A Thesis Submitted, Department of Mechanical Engineering, National Institute of Technology, Rourkela, 2009, 32 Pages.

"Advanced Spectral Analysis", Downloaded from the internet :<www.pdma.com/pdfs/Articles/Advanced_Spectral_Analysis.pdf> on Dec. 26, 2012, 9 Pages.

Donald V. Ferree & Nissen Burstein, "Electric Signature Analysis," UltraCheck Diagnostics, Downloaded from the internet :<http://www.us.areva-np.com/ultracheck/pdf/empath-techpaper1.pdf>, on Jun. 3, 2013, 8 Pages.

Devaney, MJ, et al., "Bearing Damage detection via Wavelet Packet Decomposition of the Stator Current", IEEE Transactions on Instrumentation and Measurement, IEEE Service Center, Piscataway, NJ, USA, Apr. 1, 2004.

European search report issued in connection with EP Application No. 13196552.7, Mar. 19, 2014.

* cited by examiner

FAULT DETECTION SYSTEM AND ASSOCIATED METHOD

BACKGROUND

The technology disclosed herein relates generally to fault detection of electromechanical machines (EMM). More specifically, the subject matter relate to detection of bearing faults within a drive train coupled to an electromechanical machine.

Electromechanical machines having electrical generators, motors and a drive train may generate torsional and radial vibrations due to presence of defective components such as bearings, gears, or the like. Conventionally, vibration analysis of electro mechanical machines may be performed to monitor operating conditions of the machine. Mechanical faults in electromechanical systems having a drive train may generate vibrations at the rotor rotating frequency. Analysis of rotor rotating frequency facilitates to detect mechanical faults associated with the drive train. Vibration signals may be used to effectively monitor radial vibrations. But, it has been found that vibration signals cannot detect all types of faults associated with the various components of the drive train.

Further, torsional vibrations generated by the defective drive-train components that exist outside of the machine may not be captured. Although, certain conventional techniques are available for determining faults in gears of the drive train, a bearing fault in the drive train may not be effectively determined by conventional techniques.

Therefore, there exists a need for an improved method and system for monitoring a fault condition of a mechanical device in an EMM.

BRIEF DESCRIPTION

In accordance with one exemplary embodiment, a method of detecting faults in a mechanical device of an EMM is disclosed. The method includes obtaining a measured electrical signal from an electrical device coupled to a mechanical device and generating a signal signature representative of a fault in the mechanical device based on the measured electrical signal. The method also includes determining a diagnostic parameter based on a harmonic frequency of the signal signature and determining the fault in the mechanical device based on the diagnostic parameter.

In accordance with another exemplary embodiment, a system for detecting faults in a mechanical device of an EMM is disclosed. The system includes a processor based device configured to obtain a measured electrical signal from an electrical device coupled to a mechanical device and to generate a signal signature representative of a fault in the mechanical device based on the measured electrical signal. The processor based device is further configured to determine a diagnostic parameter based on a harmonic frequency of the signal signature and to determine the fault in the mechanical device based on the diagnostic parameter.

In accordance with another exemplary embodiment, a non-transitory computer readable medium encoded with a program to instruct a controller based device is disclosed. The program instructs the processor based device to obtain a measured electrical signal from an electrical device coupled to a mechanical device and to generate a signal signature representative of a fault in the mechanical device based on the measured electrical signal. The program further instructs the processor based device to determine a diagnostic parameter based on a harmonic frequency of the signal signature and to determine the fault in the mechanical device based on the diagnostic parameter.

DRAWINGS

These and other features and aspects of embodiments of the present technology will become better understood when the following detailed description is read with reference to the accompanying drawings in which like characters represent like parts throughout the drawings, wherein.

DETAILED DESCRIPTION

Embodiments of the present technology relate to a system and method for detecting bearing faults in a mechanical device of an EMM. A measured electrical signal is received from an electrical device of the EMM. A signal signature representative of a bearing fault in the mechanical device is determined based on the measured electrical signal. One or more diagnostic parameters are determined based on the signal signature. One or more faults of the mechanical device are determined based on the determined diagnostic parameters.

Figure 1:
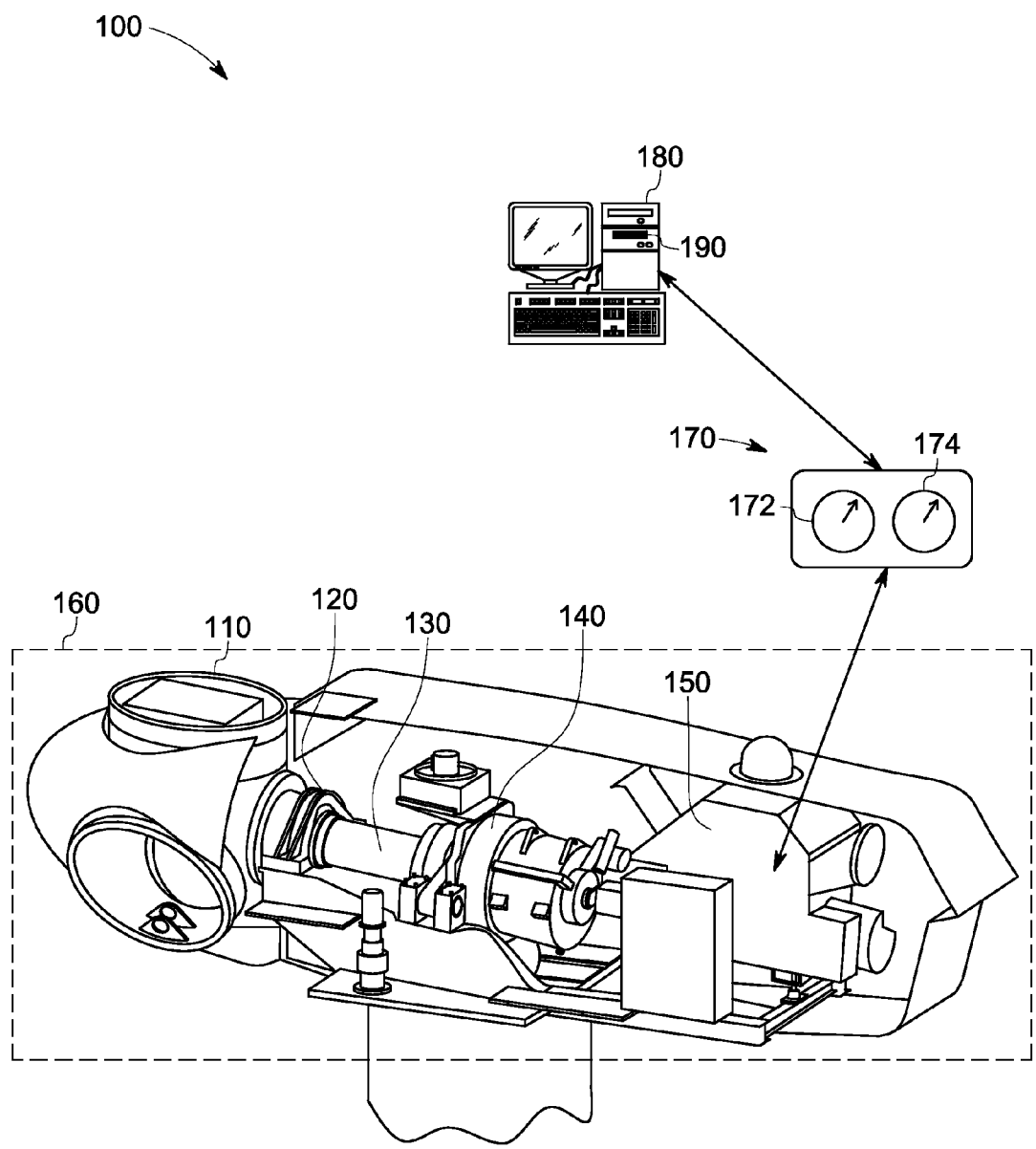
FIG. 1 is a diagrammatic illustration of a system having a fault detection system accordance with an exemplary embodiment.

FIG. 1 is a diagrammatic illustration of a system 100 in accordance with an exemplary embodiment of the present technology. The system 100 includes an EMM 160 having at least one electrical device 150 and a mechanical device 140. The system 100 has an electrical sensing device 170 to measure electrical signals from the EMM 160. The system 100 has a processor based device 180 for receiving electrical signals from the sensing device 170. In the illustrated embodiment, the electrical device 150 is a generator generating output power 208, and the mechanical device 140 is a drive train. The EMM 160 may also include a rotor assembly 110, a main bearing 120, and a main shaft 130.

In the illustrated embodiment, the sensing device 170 includes a current sensor 712 for sensing current and a voltage sensor 174 for sensing voltage of the generator 150. The number of electrical sensors may vary depending on the application. In one embodiment, the current sensor 172 measures current flowing through one or more phases of the generator 150. Similarly, the voltage sensor 174 may measure voltage across one or more phases of the generator 150. While certain embodiments of the present technology may be discussed with respect to a multi-phase generator, it should be noted herein that in other embodiments of the present technology, other types of multi-phase EMM may be envisioned. Other types of electrical sensors may also be envisioned within the scope of the present technology.

The processor based device 180 receives signals measured by the electrical sensing device 170. The processor based device 180 may be a general purpose computer, or a Digital Signal Processor (DSP) or a controller. The processor based device 180 may have an input device (not shown) such as a keyboard, a mouse, and a control for receiving additional information from a user to configure the processor based device to perform various embodiments of the present technique. The processor based device 180 may have a memory 190 which is a random access memory (RAM), read only memory (ROM), or any other form of computer readable memory accessible by the processor based device 180. The memory 190 may be encoded with a program to instruct the processor based device 180 to enable a sequence of steps to determine a fault of the drive train 140. The processor based device 180 may be suitably configured to monitor and detect fault conditions of a bearing of the drive train 140 disposed within the EMM 160.

Figure 2:
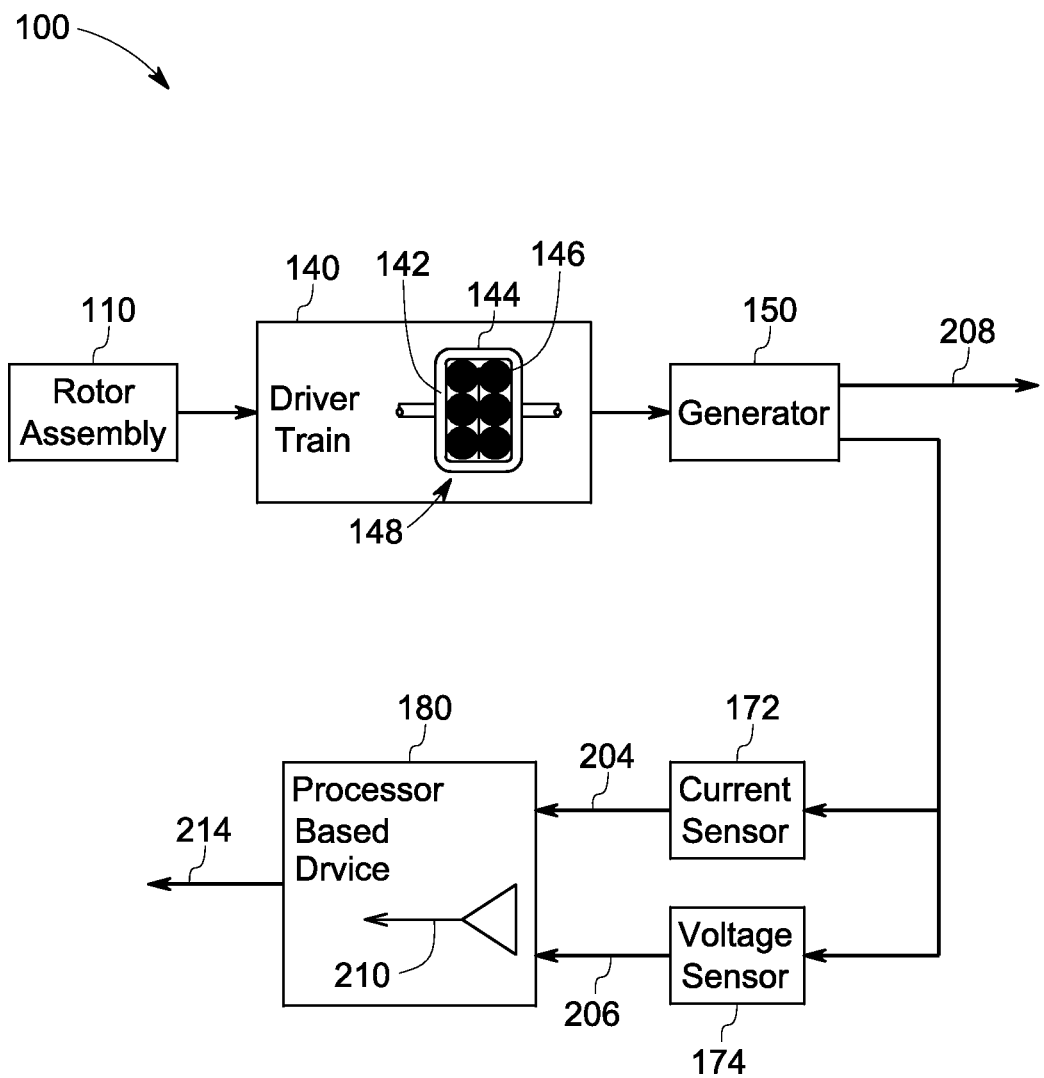
FIG. 2 is a block diagram of a fault detection system in accordance with an exemplary embodiment.

FIG. 2 is a block diagram of the system 100 in accordance with an exemplary embodiment. As discussed with reference to FIG. 1, the rotor assembly 110 is coupled to the generator 150 via the drive train 140. Electrical signals 204, 206 measured by the sensors 172, 174 respectively are representative of current and voltage signals respectively of the generator 150. Specifically, the electrical signal 204 is representative of an electric current of the generator 150 coupled to the drive train 140. The electric signal 206 is representative of an electric voltage of the generator 150 coupled to the drive train 140. As illustrated in the block diagram, the drive train 140 has a bearing 148 with an inner race 142, an outer race 144 and ball bearings 146 in between. The processor based device 180 generates an electrical signal signature 210 based on at least one of the electrical signals 204, 206. A fault detection signal 214 is determined based on electrical signal signature 210. The fault detection signal 214 may be representative of one or more diagnostic parameters. It should be noted herein that the terms "fault detection signal" and "diagnostic parameter" may be used interchangeably. In the illustrated embodiment, the fault detection signal 214 may be representative of various faults associated with the drive train 140, including but not limited to bearing faults, and gear faults of the drive train 140. In certain embodiments, the faults of the drive train 140 may include but not limited to high speed (HS) shaft gear fault, HS intermediate gear fault, planet gear fault, ring gear fault, sun gear fault, or the like. In some embodiments, additionally, the signal 214 may be indicative of HS shaft bearing fault, high speed intermediate shaft (HSIS) fault, low speed intermediate shaft (LSIS) fault, planet bearing fault, or the like.

The faults of the bearing 148 of the drive train 140 generate two types of vibrations, namely torsional and radial vibrations. Torsional vibrations may be more suited to determine bearing faults of the drive train 140. For example, the condition of the bearing 148 of the drive train 140 may be determined by determining a frequency and a magnitude of the torsional vibration signal generated by the drive train 140. Typically, components in "good condition" generate smaller amplitude vibrations than components in "poor condition". The frequency components of the vibrations produced by the bearing 148 are unique to the drive train design and shaft rotation speed. The frequency components and amplitudes of the measured electrical signals 204, 206 of the generator 150 correspond to a plurality of bearing faults of the drive train 140. Electrical Signature Analysis (ESA) is a non-intrusive technique for monitoring the condition of mechanical components within rotating machines. The electrical signals 204, 206 measured by the sensors 172, 174, are received by the processor based device 180. Electrical signature analysis (ESA) is performed by the processor based device 180 based on the electrical signals 204, 206 to generate the signal signature 210. Based on the signal signature 210, one or more diagnostic parameters 214 representative of bearing faults of the drive train 140 is determined. In an embodiment of the present technique, a current signature analysis (CSA) is performed by the processor based device 180 based on the current signal 204 to determine the bearing faults of the drive train 140.

One exemplary technique of the electrical signature analysis involves analyzing the frequency components of the electrical signal signature 210. In one embodiment, the processor based device 180 determines a fast Fourier transform of the electrical signals 204, 206 representative of vibrations of the bearing 148 of the drive train 140 to determine the signal signature 210. Further, a plurality of diagnostic parameters is determined based on the signal signature 210 to identify location or severity of the bearing faults in the drive train 140.

Figure 3:
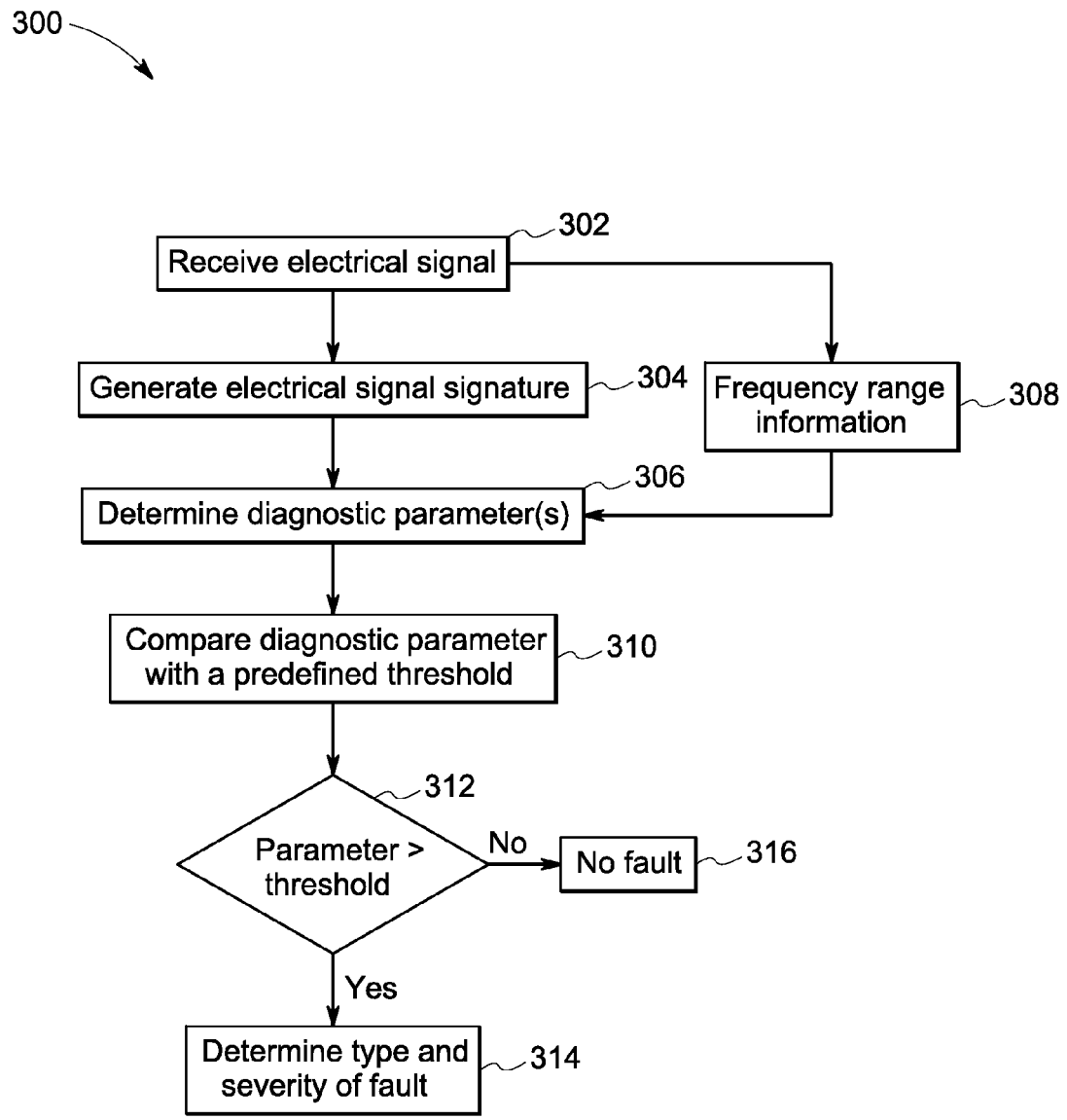
FIG. 3 is a flow chart illustrating exemplary steps involved in detection of faults in a drive train in accordance with an exemplary embodiment.

FIG. 3 is a flow chart outlining an exemplary technique 300 of fault detection in the mechanical device (e.g., drive train) in accordance with an exemplary embodiment. The processor based device receives at least one electrical signal 302 and generates an electrical signal signature 304 based on the electrical signal 302. The electrical signals may be representative of at least one of a measured voltage, and a measured current of the electrical device. The electrical signal signature is determined by determining a spectrum of at least one of the electrical signals. The electrical signal signature is representative of a frequency spectrum of the electrical signal. In some embodiments, the frequency spectrum may be a Fourier transform, a discrete Fourier transform, a wavelet transform or any other transformation that is representative of frequency components of the signal signature. The signal signature may also be a power spectral density of the electrical signal. The power spectral density of the electrical signal is the amplitude of the square of the frequency spectrum of the electrical signal. In an embodiment of the present technique, the signal signature may be generated by determining Hilbert transform of the electrical signal. It should be noted herein that the electrical signal signature may be modified to generate another signal signature, which may also be referred to as a sequel electrical signal signature.

Figure 4A:
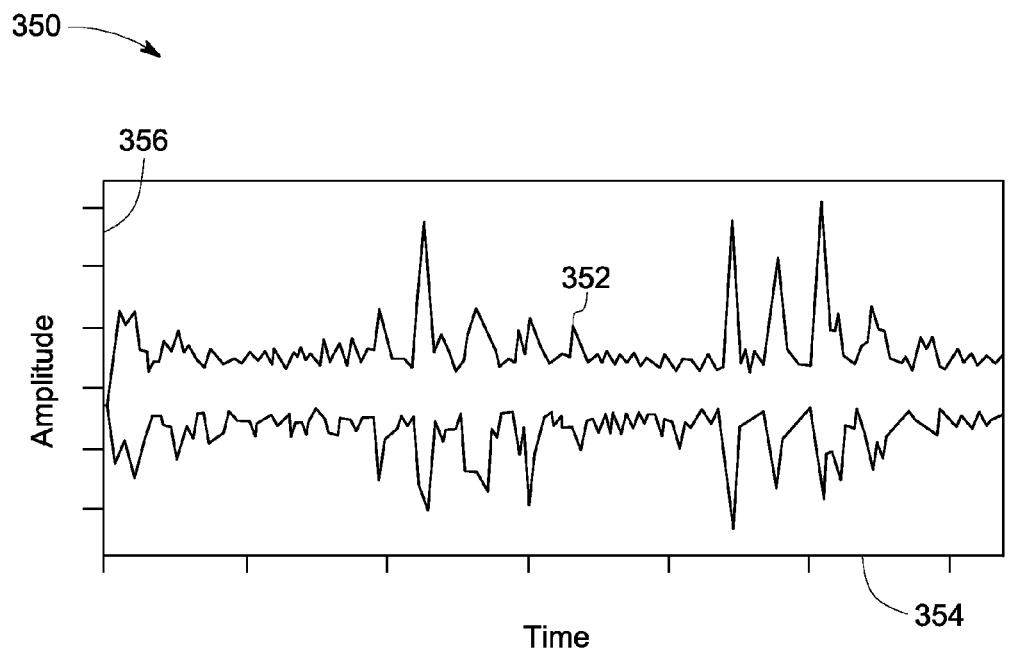
FIG. 4A is a graph of time domain electrical signal and FIG. 4B is a graph of corresponding frequency spectrum in accordance with an exemplary embodiment.

FIG. 4A is a graph 350 representing time (x-axis) 354 versus amplitude of a signal (y-axis) 356. Curve 352 is representative of a time domain electrical signal.

Figure 4B:
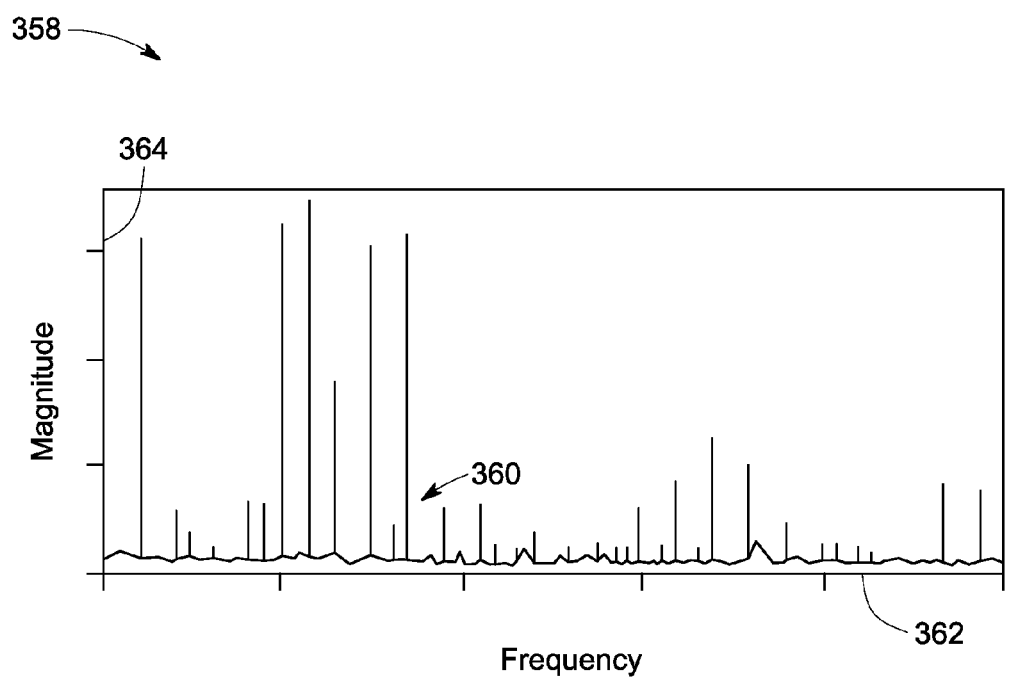

FIG. 4B illustrates a graph 358 of a spectrum of the signal 352 (shown in FIG. 4A). The plot 358 representing frequency (x-axis) 362 versus the magnitude of the spectrum (y-axis) 364. Curve 360

Again referring back to FIG. 3, a diagnostic parameter is determined based on electrical signal signatures 306. The method of determining the diagnostic parameter includes determining a frequency range corresponding to a type of the bearing fault and determining a magnitude of the signal signature corresponding to the determined frequency range. The magnitude of the signal signature is representative of a statistical property of the signal signature. For example, the diagnostic parameter may be an average value, or a peak value, or a median value, or a Root Mean Square (RMS) value of the electrical signal signature. Suitable number of samples of any of the electrical signal signatures may be used to determine the diagnostic parameter. The diagnostic parameter may also be determined as a statistical property within a particular frequency range corresponding to any of the electrical signal signature. For example, an electrical signal signature in a particular frequency band is represented as, $$\underline{s(n)} = [s(n) \ s(n-1) \ \ldots \ s(n-k)], \quad (1)$$

where, $\underline{s(n)}$ is the electrical signal signature, $s(n)$, $s(n-1) \ldots s(n-k)$ are $k+1$ sample values of the electrical signal signature. The average value as the diagnostic value of the electrical signal signature $\underline{s(n)}$ is defined as:

$$Avg(\underline{s(n)}) = \frac{(s(n) + s(n-1) + \ldots + s(n-k))}{k+1}. \quad (2)$$

Similarly, as another example, the peak value as the diagnostic parameter of the electrical signal signature $\underline{s(n)}$ is defined as:

$$\text{Peak}(\underline{s(n)}) = \text{Max}[s(n), s(n-1), \ldots s(n-k)]. \quad (3)$$

In yet another example, the root mean square (RMS) value as the diagnostic parameter of the electrical signal signature $\underline{s(n)}$ is defined as:

$$\text{RMS}(\underline{s(n)}) = \frac{(s^2(n) + s^2(n-1) + \ldots + s(n-k))}{k+1}. \quad (4)$$

In certain embodiments, a plurality of diagnostic parameters are generated for determining different types of faults related to the drive train. The method of determining the type of bearing fault of the drive train includes determining a peak magnitude of the signal signature and identifying a frequency range of the signal signature, corresponding to the peak magnitude. The method further includes determining at least one of an outer race defect, an inner race defect, and a ball damage based on the identified frequency range. The diagnostic parameters may be determined based on the electrical signal signature, for frequency bands corresponding to various bearing faults of the drive train. Frequency bands 308 corresponding to bearing faults are derived from the electrical signal signature. The frequency bands corresponding to various bearing faults are non-overlapping. The frequency band corresponding to a bearing fault in the drive train depends on the geometrical dimensions of the particular component, and operating parameters of the drive train. The operating parameters of the drive train may include, but not limited to, rotor speed, rotor excitation frequency, stator output frequency, load and shaft speed of the EMM. The frequency range corresponding to the fault is also dependent on electrical signal signature analysis model adopted in determining the fault. In an alternative embodiment, the diagnostic parameter is determined based on a harmonic frequency of the signal signature. The amplitudes of harmonics and frequency separation between sideband peak amplitudes may be used to determine the diagnostic parameter.

In an exemplary embodiment, a Fourier transform of the measured electrical signal is determined. The frequency $f_{bearing}$ of the electrical signal signature corresponding to the bearing fault of the drive train is determined as follows:

$$f_{bearing}: \quad \text{Outer.raceway} \ \ldots \ f_{orw} = \frac{N_b}{2} f_r \left(1 - \frac{D_b}{D_c} \cos\beta\right) \quad (4)$$

$$\text{Inner.raceway} \ \ldots \ f_{irw} = \frac{N_b}{2} f_r \left(1 + \frac{D_b}{D_c} \cos\beta\right)$$

$$\text{Ball} \ \ldots \ f_{ball} = \frac{D_c}{D_b} f_r \left(1 - \frac{D_b^2}{D_c^2} \cos^2\beta\right)$$

where $f_{orw}$ is the frequency corresponding to outer raceway fault, $f_{irw}$ is the frequency corresponding to inner raceway fault, and $f_{ball}$ is the frequency corresponding to ball damage. $N_b$ is the number of balls in the bearing, $D_b$, $D_c$, and $\beta$ are the dimensional parameters of the bearing, $f_r$ is the stator current frequency corresponding to rotor speed. The stator current frequency corresponding to the bearing fault is represented by:

$$f_s = |f_{fundamental} \pm k \cdot f_{bearing}| \quad (5)$$

where, $f_s$ is the stator current frequency, $f_{fundamental}$ is the stator output frequency, $k$ is a constant corresponding to different failure modes.

In a specific embodiment, the frequency corresponding to an outer race fault of an intermediate gear is determined based on the physical and operational parameters of the drive train. The bearing frequency is computed from equation (4) as:

$$f_{bearing} = \frac{N_b}{2} (f_{shaftspeed} \div f_{fundamental}) \times \text{Gear\_ratio} \times \left(1 - \frac{D_b}{D_c} \cos\beta\right)$$

where, $f_{shaftspeed}$ is the rotational speed of the shaft, $f_{fundamental}$ is the fundamental frequency of 60 Hz, Gear_ratio is the teeth ratio corresponding to the intermediate gear. The bearing frequency is the frequency corresponding to the outer race fault $f_{orw}$. The stator current frequency corresponding to outer race fault of the bearing of the drivetrain is calculated according to equation (5) as $$f_s = |f_{fundamental} \pm k \cdot f_{orw})$$

An amplitude of the electrical signal signature at a frequency $f_s$ is representative of information about the outer race fault of the intermediate gear of the drive train. A peak amplitude of the electrical signal signature is representative of the diagnostic parameter corresponding to the outer race fault of the bearing of the drive train. The diagnostic parameter is compared with a predefined threshold 310. If the diagnostic parameter is greater than the predefined threshold 312, then an outer race fault of the bearing is determined 314. If the diagnostic parameter is less than the predefined threshold, then the bearing of the drive train is do not have an outer race fault 316.

The method further includes determining fault severity of each determined bearing fault of the drive train. The method of determining the severity of the bearing fault of the drive train includes identifying a frequency range of the signal signature, corresponding to the type of the bearing fault in the drive train. The method further includes determining a peak magnitude of the signal signature, corresponding to the frequency range and determining the severity of the bearing fault based on the determined peak magnitude. For example, each of the bearing faults may be classified as mild, medium or high severity. To determine the severity of a particular fault, the diagnostic parameter corresponding to the bearing fault may be compared with two thresholds. If the diagnostic parameter is less than both the thresholds, the fault may be classified as low severity. If the diagnostic parameter is in between the two thresholds, the fault may be classified as medium severity. If the diagnostic parameter is greater than both the thresholds, the fault may be classified as high severity.

The threshold values discussed herein are determined apriori based on baseline measurements from a faultless drive train. In one embodiment, the signal signatures are determined for an EMM operating under normal conditions without any faults. A peak value of the signal signature in a suitable frequency band corresponding to a drive train fault is determined. Such a peak value is used to define a pre-defined threshold corresponding to the bearing fault. To improve the fault detection accuracy, a set of thresholds are determined apriori for each type of the bearing fault, including inner raceway fault, outer raceway fault and ball defect. A plurality of current and voltage signals for baseline conditions and fault detection conditions are measured for each component and corresponding threshold values are set. For example, to differentiate a deteriorated drive train condition from an inner raceway fault, a warning threshold value for the Root Mean Square (RMS) value of the stator current spectrum of the drive train, in a frequency range corresponding to the inner raceway fault is determined. An inner raceway fault may be detected if there is a variation between the stator current spectrum and the determined warning threshold value. To avoid misjudgment due to insufficient data, the controller based device measures a plurality of samples of the stator current, for example, around 30-50 samples of measurement values of the stator current. When the RMS value of the stator current value exceeds the pre-defined threshold value, an inner raceway fault in the drive train is determined. Similarly, corresponding to each type of the drive train fault, one or more additional threshold values are determined to identify severity of the fault.

Figure 5:
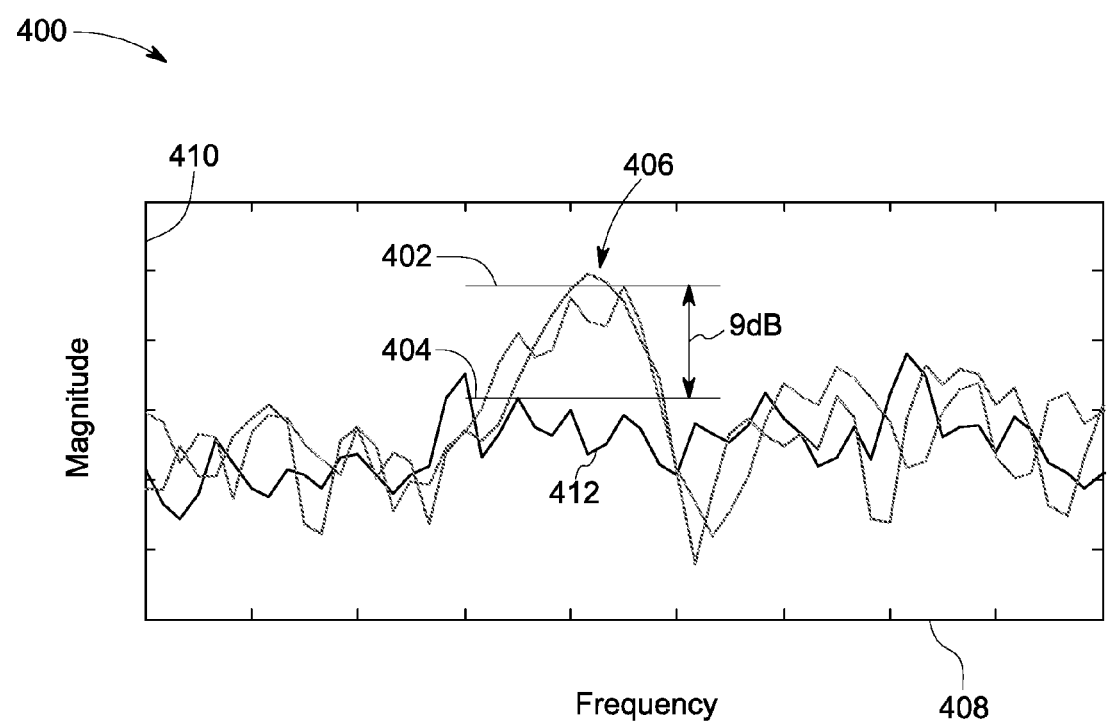
FIG. 5 is a graphical representation of a stator current in the frequency domain of a damaged drive train having an outer race bearing fault in accordance with an exemplary embodiment.

FIG. 5 is a graphical representation 400 of a sample stator current in the frequency domain of a damaged drive train having an outer race bearing fault. The x-axis 408 represents frequency in Hz (Hertz) and the y-axis 410 represents amplitude in dB (Decibel) of the stator current spectrum. Curve 412 represents a spectrum of a stator current flow through a healthy drive train while curve 406 represents a spectrum of a stator current flow through a faulty drive train having an outer race bearing fault. The spectrum peak 402 of the curve 406 is representative of the stator current due to the drive train fault is higher compared to the spectrum peak 404 of the curve 412 representative of the stator current of the healthy drive train. In the illustrated embodiment, the difference between the spectrum peaks 404, 402 representative of a healthy drive train condition and a faulty drive train condition, is about 9 dB.

In accordance with the embodiments discussed herein, bearing faults in a drive train of an EMM are determined by using one or more electrical signals measured from one or more electric sensors. Electrical signal signatures are derived from the electrical signals. Based on the electrical signal signatures, various bearing faults of the drive train 140 are determined. Use of electrical signals in determining the bearing faults of the drive train provides enhanced capability of detecting faults in the bearing of the drive train in contrast to the use of vibration signals for the same purpose.

It is to be understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the invention are not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the inventions may include only some of the described embodiments. Accordingly, the inventions are not to be seen as limited by the foregoing description, but are only limited by the scope of the appended claims.

What is claimed as new and desired to be protected by Letters Patent of the United States is:

1. A method, comprising:
   using a sensor for obtaining a measured electrical signal from an electrical device comprising an electrical generator coupled to a mechanical device comprising a mechanical drive train, wherein the measured electrical signal is representative of torsional vibrations generated by the mechanical device;
   generating a signal signature representative of a bearing fault of a bearing in the mechanical device based on the measured electrical signal;
   determining a diagnostic parameter based on a harmonic frequency of the signal signature, geometric dimensions of the bearing, and operating parameters of the mechanical drive train;
   determining the bearing fault in the mechanical device based on the diagnostic parameter and taking a corrective action in response to the determined bearing fault.

2. The method of claim 1, wherein the measured electrical signal is representative of at least one of a measured current and a measured voltage of the electrical device.

3. The method of claim 1, wherein generating the signal signature comprises determining a spectrum of the electrical signal.

4. The method of claim 1, wherein determining the bearing fault in the mechanical device_comprises comparing the diagnostic parameter with a predefined threshold value.

5. The method of claim 1, wherein generating the signal signature comprises determining at least one of a fast fourier transform, a discrete fourier transform, a wavelet transform, a power spectral density of the electrical signal.

6. The method of claim 1, wherein determining the diagnostic parameter comprises:
   determining a frequency range corresponding to a type of the bearing fault of the bearing in the mechanical device; and
   determining a magnitude of the signal signature corresponding to the determined frequency range.

7. The method of claim 6, wherein the magnitude is representative of at least one of an average value, a peak value, or a median value of the signal signature.

8. The method of claim 1, wherein determining the bearing fault of the bearing in the mechanical device comprises determining at least one of a type of the bearing fault and a severity of the bearing fault.

9. The method of claim 8, wherein determining the type of the bearing fault comprises:
   determining a peak magnitude of the signal signature;
   identifying a frequency range of the signal signature, corresponding to the peak magnitude; and
   determining at least one of an outer race defect, an inner race defect, and a ball damage based on the identified frequency range.

10. The method of claim 8, wherein determining the severity of the bearing fault comprises:
   identifying a frequency range of the signal signature, corresponding to the type of the bearing fault of the bearing in the mechanical device;
   determining a peak magnitude of the signal signature, corresponding to the frequency range; and
   determining the severity of the bearing fault based on the determined peak magnitude.

11. The method of claim 1, wherein the operating parameters of the mechanical drive train comprise a rotational speed of a shaft and the dimensions of the bearing comprise a gear ratio of an intermediate gear of the mechanical drive train.

12. A system comprising:
   a mechanical device comprising a mechanical drive train;
   an electrical device comprising an electrical generator coupled to the mechanical device;
   a sensor for obtaining a measured electrical signal representative of torsional vibrations generated by the mechanical device; and
   a processor based device configured to:
   receive the measured electrical signal;
   generate a signal signature representative of a bearing fault of a bearing in the mechanical device based on the measured electrical signal;
   determine a diagnostic parameter based on a harmonic frequency of the signal signature, geometric dimensions of the bearing, and operating parameters of the mechanical drive train;
   determine the bearing fault in the mechanical device based on the diagnostic parameter and taking a corrective action in response to the determined bearing fault.

13. The system of claim 12, wherein the measured electrical signal is representative of at least one of a measured current and a measured voltage of the electrical device.

14. The system of claim 12, wherein the processor based device is configured to generate the signal signature by determining a spectrum of the electrical signal.

15. The system of claim 12, wherein the processor based device is further configured to determine the bearing fault of the bearing in the mechanical device by comparing the diagnostic parameter with a predefined threshold value.

16. The system of claim 12, wherein the processor based device is configured to generate the signal signature by determining at least one of a fast fourier transform, a discrete fourier transform, a wavelet transform, and power spectral density of the electrical signal.

17. The system of claim 12, wherein the processor based device is further configured to:
   determine a frequency range corresponding to a type of the bearing fault; and
   determine a magnitude of the signal signature corresponding to the determined frequency range.

18. The system of claim 17, wherein the processor based device is configured to determine the magnitude by computing at least one of an average value, a peak value, a median value of the signal signature.

19. The system of claim 12, wherein the processor based device is configured to determine the bearing fault of the bearing in the mechanical device by determining at least one of a type of the bearing fault and a severity of the bearing fault.

20. The system of claim 19, wherein the processor based device is configured to:
   determine a peak magnitude of the signal signature;
   identify a frequency range of the signal signature, corresponding to the peak magnitude; and
   determine the type of the bearing fault comprising at least one of an outer race defect, an inner race defect, and a ball damage based on the identified frequency range.

21. The system of claim 19, wherein the processor based device is configured to:
   identify a frequency range of the signal signature, corresponding to the type of the bearing fault of the bearing in the mechanical device;
   determine a peak magnitude of the signal signature, corresponding to the frequency range; and
   determine the severity of the bearing fault based on the determined peak magnitude.

22. The system of claim 12, wherein the operating parameters of the mechanical drive train comprise a rotational speed of a shaft and the dimensions of the bearing comprise a gear ratio of an intermediate gear of the mechanical drive train.

23. A non-transitory computer readable medium encoded with a program to instruct a processor based device to:
   obtain a measured electrical signal from an electrical device comprising an electrical generator coupled to a mechanical device comprising a mechanical drive train, wherein the measured electrical signal is obtained using a sensor and is representative of torsional vibrations generated by the mechanical device;
   generate a signal signature representative of a bearing fault of a bearing in the mechanical device based on the measured electrical signal;
   determine a diagnostic parameter based on a harmonic frequency of the signal signature, geometric dimensions of the bearing, and operating parameters of the mechanical drive train;
   determine the bearing fault in the mechanical device based on the diagnostic parameter and taking a corrective action in response to the determined bearing fault.

* * * * *